(12) United States Patent
Daikoku

(10) Patent No.: US 11,536,892 B2
(45) Date of Patent: Dec. 27, 2022

(54) METHOD FOR MANUFACTURING LIGHT-EMITTING MODULE

(71) Applicant: NICHIA CORPORATION, Anan (JP)

(72) Inventor: Shinichi Daikoku, Tokushima (JP)

(73) Assignee: NICHIA CORPORATION, Anan (JP)

( * ) Notice: Subject to any disclaimer, the term of this patent is extended or adjusted under 35 U.S.C. 154(b) by 189 days.

(21) Appl. No.: 17/125,989

(22) Filed: Dec. 17, 2020

(65) Prior Publication Data
US 2021/0191031 A1   Jun. 24, 2021

(30) Foreign Application Priority Data

Dec. 20, 2019  (JP) .............................. JP2019-230073
Dec. 24, 2019  (JP) .............................. JP2019-232693

(51) Int. Cl.
*H01L 33/58* (2010.01)
*H01L 33/62* (2010.01)
*F21V 8/00* (2006.01)
*H01L 25/075* (2006.01)

(52) U.S. Cl.
CPC ......... *G02B 6/0065* (2013.01); *G02B 6/0035* (2013.01); *H01L 25/0753* (2013.01); *H01L 33/58* (2013.01); *H01L 33/62* (2013.01); *H01L 2933/0058* (2013.01); *H01L 2933/0066* (2013.01)

(58) Field of Classification Search
CPC ..... G02B 6/0021; G02B 6/0068; H01L 33/58; G02F 1/133606
See application file for complete search history.

(56) References Cited

U.S. PATENT DOCUMENTS

| | | |
|---|---|---|
| 2005/0265029 A1 | 12/2005 | Epstein et al. |
| 2009/0180282 A1 | 7/2009 | Aylward et al. |
| 2017/0005238 A1* | 1/2017 | Hung .................. H01L 21/6835 |
| 2018/0239193 A1 | 8/2018 | Hayashi |
| 2019/0049649 A1 | 2/2019 | Hayashi et al. |

(Continued)

FOREIGN PATENT DOCUMENTS

| | | |
|---|---|---|
| JP | 2005018997 A | 1/2005 |
| JP | 2008503034 A | 1/2008 |

(Continued)

*Primary Examiner* — Andrew J Coughlin
(74) *Attorney, Agent, or Firm* — Hunton Andrews Kurth LLP

(57) ABSTRACT

A light-emitting module manufacturing method of the present disclosure includes: providing a plurality of light sources each including a semiconductor layered structure and an electrode; providing a lightguide plate having a first principal surface to serve as a light extraction surface, a second principal surface opposite to the first principal surface, and a plurality of through holes penetrating through the lightguide plate from the first principal surface to the second principal surface; providing a light modulating member in each of the through holes; providing a plurality of bonding members on the light modulating member; equalizing heights of upper surfaces of the plurality of bonding members; placing the light sources on the bonding members such that the electrode faces away from the light modulating member; providing a cover member so as to cover the second principal surface; and forming an interconnect layer electrically coupled with the light sources.

12 Claims, 14 Drawing Sheets

(56) References Cited

U.S. PATENT DOCUMENTS

| | | | | |
|---|---|---|---|---|
| 2020/0013933 A1* | 1/2020 | Daikoku | ............... | G02B 6/0011 |
| 2020/0057190 A1* | 2/2020 | Daikoku | ............... | G02B 6/0021 |

FOREIGN PATENT DOCUMENTS

| | | | |
|---|---|---|---|
| JP | 2009193955 | A | 8/2009 |
| JP | 2012204337 | A | 10/2012 |
| JP | 2015153881 | A | 8/2015 |
| JP | 2018133304 | A | 8/2018 |
| JP | 2019012681 | A | 1/2019 |
| KR | 1020090117419 | A | 11/2009 |

* cited by examiner

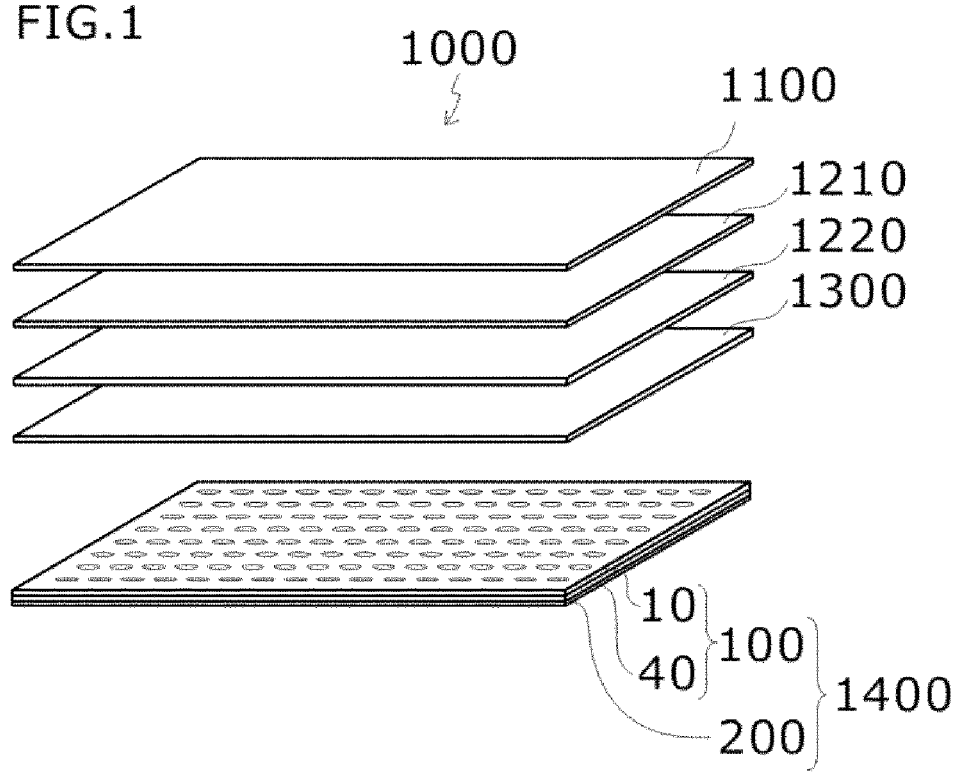

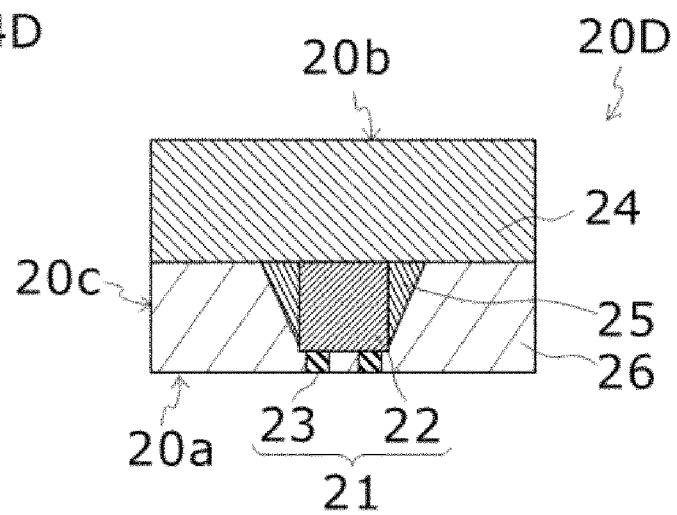
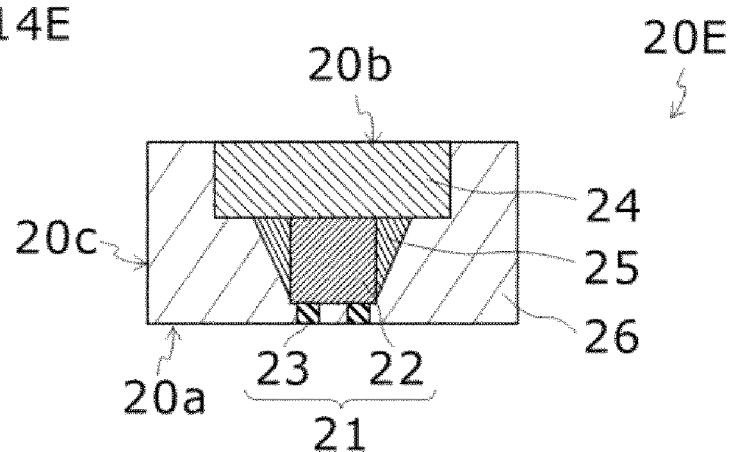

METHOD FOR MANUFACTURING LIGHT-EMITTING MODULE

CROSS REFERENCE TO RELATED APPLICATION

This application claims priority to Japanese Patent Application No. 2019-230073, filed on Dec. 20, 2019, and Japanese Patent Application No. 2019-232693, filed on Dec. 24, 2019, the disclosures of which are hereby incorporated by reference in their entireties.

BACKGROUND

The present disclosure relates to a light-emitting module and a method for manufacturing a light-emitting module.

SUMMARY

In certain general aspect, a method for manufacturing a light-emitting module according to the present disclosure includes:

providing a plurality of light sources each including a semiconductor layered structure and an electrode;

providing a lightguide plate having a first principal surface to serve as a light extraction surface, a second principal surface opposite to the first principal surface, and a plurality of through holes penetrating through the lightguide plate from the first principal surface to the second principal surface;

providing a light modulating member in each of the through holes;

providing a plurality of bonding members on the light modulating member;

equalizing heights of upper surfaces of the plurality of bonding members;

placing the light sources on the bonding members such that the electrode faces away from the light modulating member;

providing a cover member so as to cover the second principal surface; and forming an interconnect layer electrically coupled with the light sources.

According to the above aspect, it is possible to provide a light-emitting module that can have a reduced thickness.

BRIEF DESCRIPTION OF THE DRAWINGS

FIG. 1 is a configuration diagram schematically showing components of an exemplary liquid crystal display device according to an embodiment of the present disclosure.

FIG. 14D is a schematic cross-sectional view showing an example of a light source according to an embodiment of the present disclosure.

FIG. 14E is a schematic cross-sectional view showing an example of a light source according to an embodiment of the present disclosure.

DETAILED DESCRIPTION

Figure 2A:
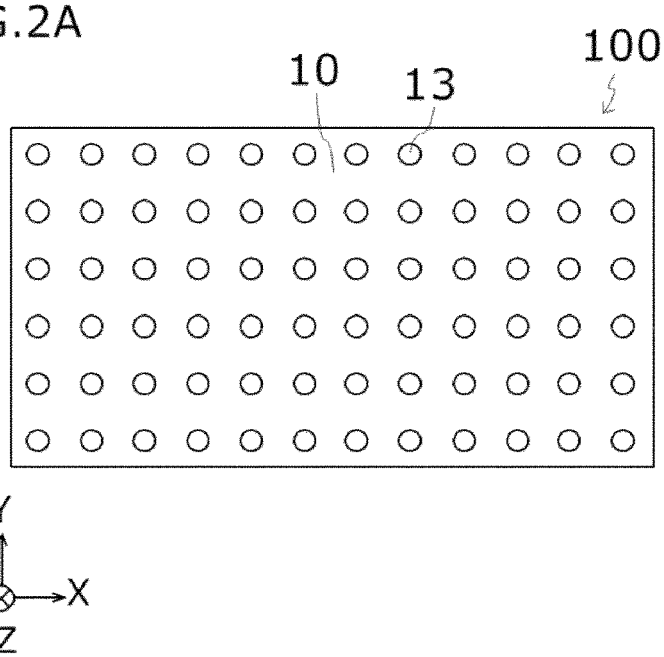
FIG. 2A is a schematic plan view showing an example of a light-emitting module according to an embodiment of the present disclosure.

Hereinafter, exemplary embodiments of the present invention are described in detail with reference to the drawings. In the following description, when necessary, terms indicating specific directions and positions (e.g., "upper", "lower", and other terms including such terms) may be used. These terms are used merely for the ease of understanding the invention with reference to the drawings, but the meanings of the terms do not limit the technical scope of the present invention. The same reference numerals that are shown in different drawings indicate identical or equivalent parts or members. Each member is to be referred to by the same name even if its state or shape changes, for example, before and after curing, before and after cutting, etc.

Embodiments described in the following sections are for illustration of light-emitting modules for the sake of embodying the technical idea of the present invention but are not to limit the present invention to the followings. The dimensions, materials, shapes, relative arrangements, etc., of constituent components described in the following sections do not intend to limit the scope of the present invention only to such descriptions but intend to illustrate the present invention, unless otherwise specified. The description in the section of one embodiment or example is also applicable to other embodiments or examples. The sizes, relative positions, etc., of members shown in the drawings are sometimes exaggerated for clear understanding.

<Liquid Crystal Display Device 1000>

FIG. 1 is a configuration diagram showing components of a liquid crystal display device 1000 of the present embodiment. The liquid crystal display device 1000 shown in FIG. 1 includes, from top to bottom, a liquid crystal panel 1100, two lens sheets 1210, 1220, a diffuser sheet 1300, and a planar light source 1400. The liquid crystal display device 1000 of the present embodiment is a so-called direct-lit liquid crystal display device where the planar light source is located under the liquid crystal panel. The planar light source 1400 includes at least one light-emitting module. In the configuration shown in FIG. 1, the planar light source 1400 includes a light-emitting module 100. In the liquid crystal display device 1000, the liquid crystal panel 1100 is irradiated with light emitted from the light-emitting module 100. The liquid crystal display device 1000 may further include polarizer films, color filters, optical filters such as Dual Brightness Enhancement Films (3M™ DBEF), etc., in addition to the above-described components.

<Planar Light Source>

The planar light source 1400 includes at least one light-emitting module and at least one wiring board. The number, size, arrangement, etc., of the light-emitting modules and the wiring boards can be selected according to the size of the liquid crystal panel 1100 and the planar light source 1400.

<Light-Emitting Module>

Figure 2B:
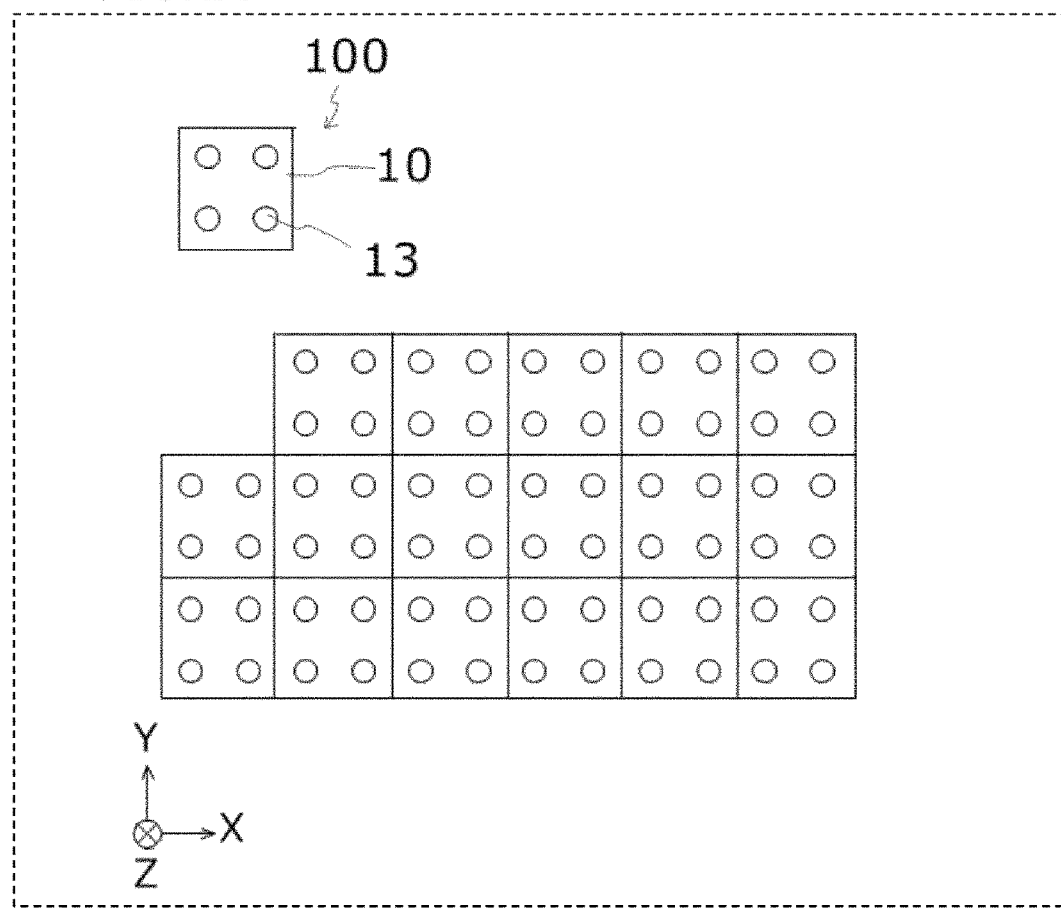
FIG. 2B is a schematic plan view showing an example of a light-emitting module according to an embodiment of the present disclosure.

The light-emitting module 100 shown in FIG. 2A is an example of the light-emitting module that has generally the same size as the planar light source 1400. The light-emitting module 100 shown in FIG. 2B is another example of the light-emitting module whose size is smaller than that of the planar light source 1400. In that case, the planar light source 1400 may comprise a plurality of the light-emitting modules 100 arranged in one-dimensional or two-dimensional array. The following description is provided with the light-emitting module 100 shown in FIG. 2B as an example.

Figure 3A:
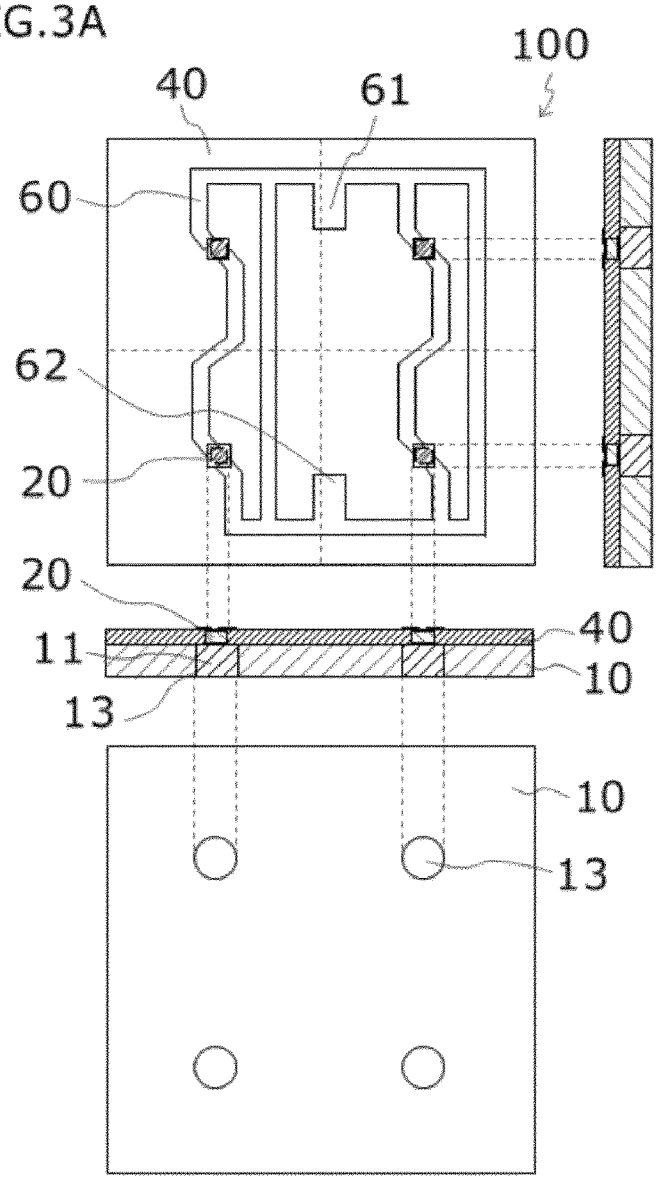
FIG. 3A shows schematic plan views and schematic cross-sectional views showing an example of a light-emitting module according to an embodiment of the present disclosure.
Figure 3B:
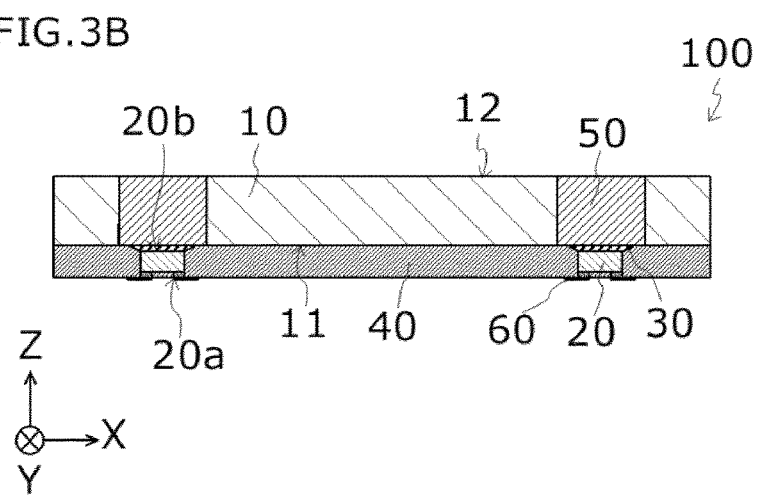
FIG. 3B is a schematic cross-sectional view showing an example of a light-emitting module according to an embodiment of the present disclosure.

FIG. 3A and FIG. 3B show an example of the light-emitting module 100 of an embodiment. The light-emitting module 100 includes a lightguide plate 10 and a plurality of light sources 20 bonded to the lightguide plate 10. Each of the light sources 20 have a first surface 20a including electrodes 23 and a second surface 20b opposite to the first surface 20a. In some cases, the light source 20 is realized by only a light-emitting device. In other cases, the light source 20 is realized by a light-emitting unit that includes a light-emitting device and other members.

The lightguide plate 10 has a first principal surface 11, a second principal surface 12 that is opposite to the first principal surface 11, and through holes 13 penetrating through the lightguide plate 10 from the first principal surface 11 to the second principal surface 12. In the through holes 13, light modulating members 50 are provided. The light modulating members 50 and the light sources 20 are bonded together by bonding members 30.

The thus-configured light-emitting module can be manufactured by a manufacturing method including the following steps.

The light-emitting module manufacturing method includes:

(1) providing a plurality of light sources each including a semiconductor layered structure and electrodes;

(2) providing a lightguide plate having a first principal surface serving as a light extraction surface, a second principal surface opposite to the first principal surface, and a plurality of through holes penetrating through the lightguide plate from the first principal surface to the second principal surface;

(3) providing a light modulating member in each of the through holes;

(4) providing a plurality of bonding members on the light modulating member;

(5) equalizing the heights of the upper surfaces of the plurality of bonding members;

(6) placing the light sources on the bonding members such that the electrodes face away from the light modulating member;

(7) providing a covering member so as to cover the second principal surface; and (8) forming an interconnect layer so as to be electrically coupled with the light sources.

In a light-emitting module of the present disclosure, the heights of the bonding members are equalized so that the variation in height of the light sources can be reduced.

Embodiment 1

A light-emitting module manufacturing method of Embodiment 1 is described in detail.

(1) Step of providing a plurality of light sources each including a semiconductor layered structure and electrodes.

A plurality of light sources are provided. Examples of the light sources 20 that may be used in the manufacturing method of the present embodiment include a solely-used light-emitting device and a light-emitting unit that includes a light-emitting device and other members, such as light sources 20A to 20F shown in FIG. 14A to FIG. 14F. The light sources 20 have the first surface (lower surface) 20a including the electrodes 23 and the second surface (upper surface) 20b opposite to the first surface 20a. When the light-emitting units are used as the light sources 20, the step of combining the light-emitting device 21 with the other members can be realized by, for example, performing part or all of the steps of forming the covering member 26 and the light-transmitting member 24 that will be described later. Alternatively, the light sources 20 can be provided by purchasing. In the following section, the respective steps of the manufacturing method of the light-emitting module 100 in which the light-emitting devices 21 are used as the light sources 20 are described.

(2) Step of providing a lightguide plate having a first principal surface serving as a light extraction surface and a second principal surface opposite to the first principal surface.

Figure 4A:
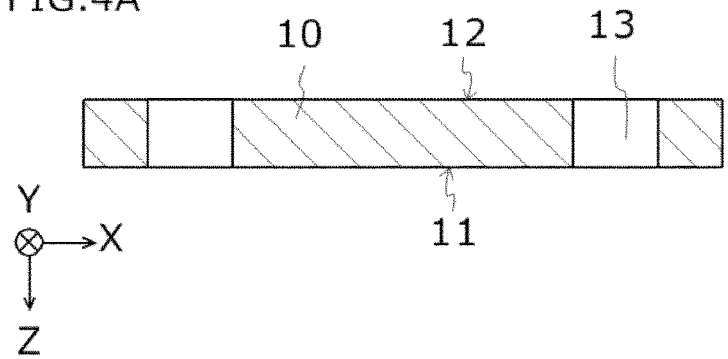
FIG. 4A is a schematic cross-sectional view showing an example of a manufacturing step of a light-emitting module according to an embodiment of the present disclosure.

As shown in FIG. 4A, a lightguide plate 10 is provided. The lightguide plate 10 is a member generally in the shape of a plate, which has the first principal surface 11 that is a light extraction surface and the second principal surface 12 that is opposite to the first principal surface 11. The lightguide plate 10 is a member for causing light from the light sources 20 to spread across its plane. The lightguide plate 10 has a plurality of through holes 13 penetrating through the lightguide plate 10 from the first principal surface 11 to the second principal surface 12. In the example described herein, a single lightguide plate 10 has four through holes 13.

The thus-configured lightguide plate 10 can be prepared by, for example, molding, such as injection molding, transfer molding, thermal transfer, etc. The through holes 13 of the lightguide plate 10 and a recessed portion 14, which will be described later, can be formed concurrently using a die in molding of the lightguide plate 10. This can reduce the positioning errors of, e.g. through holes 13, in the molding. Alternatively, the lightguide plate 10 may be provided by purchasing or preparing a light-transmitting plate that does not have the through holes 13 or the recessed portion and processing the light-transmitting plate.

Alternatively, the lightguide plate 10 may be provided by purchasing a lightguide plate that has the through holes 13 or the recessed portion 14.

(3) Step of providing a light modulating member in each of the through holes.

Figure 4B:
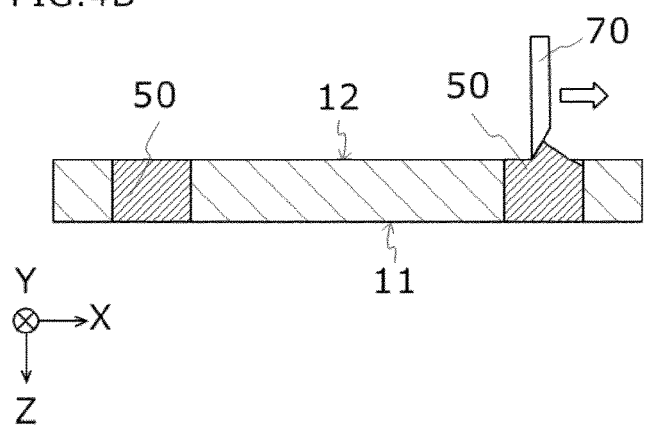
FIG. 4B is a schematic cross-sectional view showing an example of a manufacturing step of a light-emitting module according to an embodiment of the present disclosure.

A light modulating member 50 is provided in each of the through holes 13. The light modulating member 50 includes a light-reflective member. The light modulating member 50 can be provided so as to fill the entirety of the through holes 13. For example, as shown in FIG. 4B, the lightguide plate 10 is placed on a surface plate or the like such that the first principal surface 11 faces downward and the second principal surface 12 faces upward. The light modulating member 50 in a liquid form is supplied into the through holes 13 from openings on the second principal surface 12 side of the through holes 13. Herein, the liquid form refers to a flowable material, such as paste, gel, etc. When the light modulating member 50 is in a liquid form, it can be formed by a method such as transfer molding method, compression molding method, potting method, transfer method, printing method, jet dispensing method, etc. In the example shown in FIG. 4B, the light modulating member 50 is provided in the through holes 13 by a printing method with the use of a squeegee 70. Alternatively, premolded light modulating members 50 may be prepared and placed in the through holes 13. In this case, according to the size of the light modulating members 50, the light modulating members 50 may be pushed into the through holes 13.

(4) Step of providing a plurality of bonding members on the light modulating member.

Figure 4C:
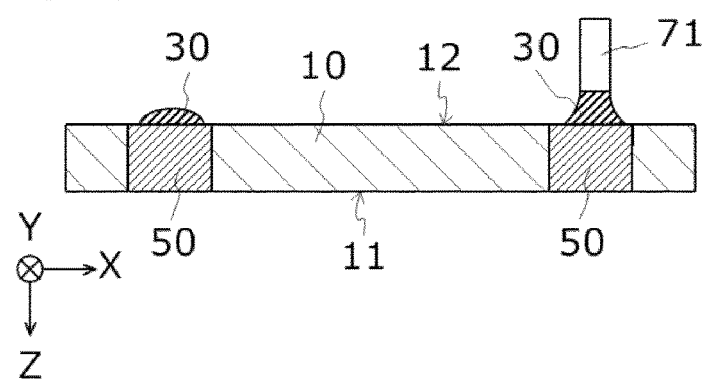
FIG. 4C is a schematic cross-sectional view showing an example of a manufacturing step of a light-emitting module according to an embodiment of the present disclosure.
Figure 4D:
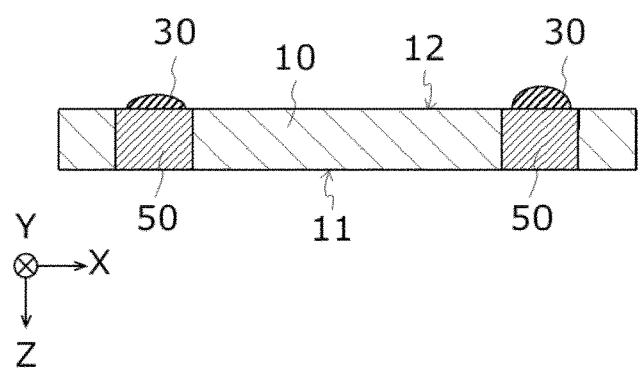
FIG. 4D is a schematic cross-sectional view showing an example of a manufacturing step of a light-emitting module according to an embodiment of the present disclosure.

Next, as shown in FIG. 4C, a bonding member 30 in a liquid form is provided on each of the light modulating members 50. The bonding member 30 may be provided by potting, transferring, printing, or the like. In the example illustrated in FIG. 4C, the bonding member 30 is provided by potting with the use of a dispensing nozzle 71. As shown in FIG. 4D, the upper surface of the bonding member 30 provided on the light modulating member 50 may be a convex surface.

(5) Step of equalizing the heights of the upper surfaces of the plurality of bonding members.

Figure 4E:
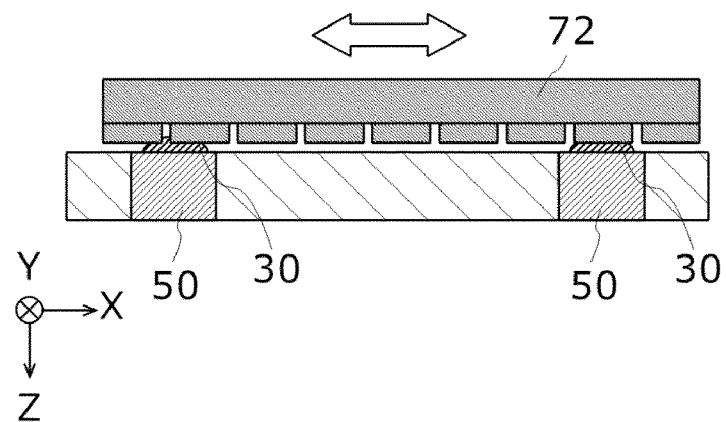
FIG. 4E is a schematic cross-sectional view showing an example of a manufacturing step of a light-emitting module according to an embodiment.
Figure 4F:
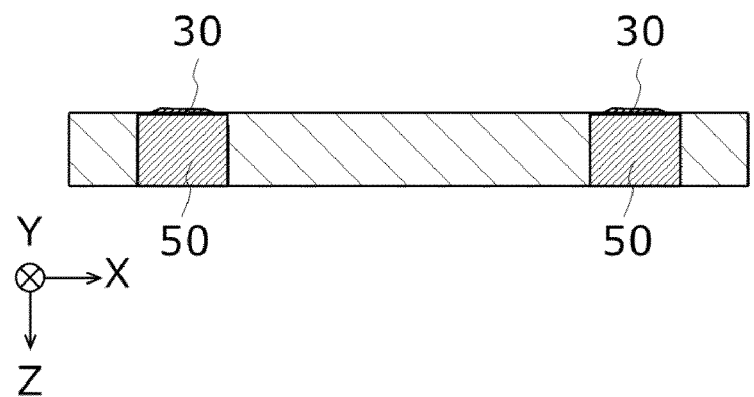
FIG. 4F is a schematic cross-sectional view showing an example of a manufacturing step of a light-emitting module according to an embodiment of the present disclosure.

Next, as shown in FIG. 4E, the heights of the upper surfaces of the plurality of bonding members 30 are equalized. Herein, the bonding members 30 are ground down by a grinding member 72 such as grindstone. Thereby, as shown in FIG. 4F, the heights of the upper surfaces of the plurality of bonding members 30 are equalized. Herein, the "height" does not refer to the thickness of the bonding members 30 but to the position of the upper surfaces of the bonding members 30 with respect to, e.g., the position of the first principal surface 11 of the lightguide plate 10. Another example of the method of equalizing the heights of the upper surfaces of the bonding members 30 is pushing down the bonding members 30.

(6) Step of placing the light sources on the bonding members such that the electrodes face away from the light modulating member.

Figure 4G:
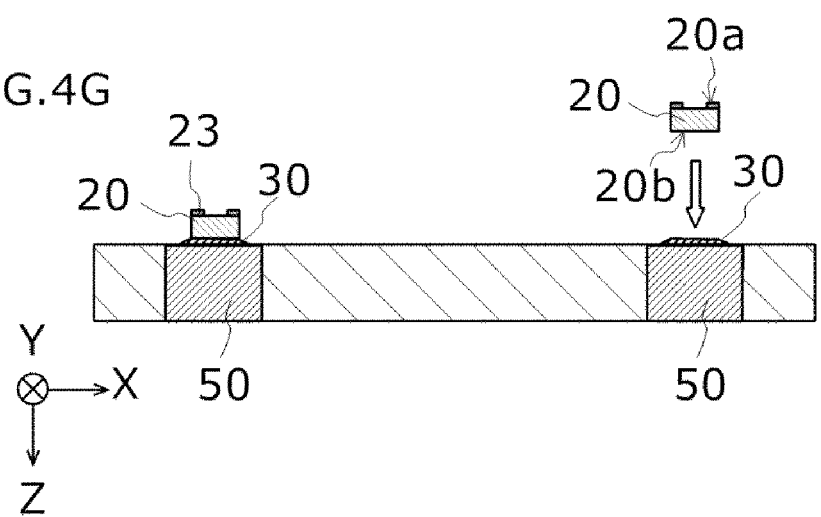
FIG. 4G is a schematic cross-sectional view showing an example of a manufacturing step of a light-emitting module according to an embodiment of the present disclosure.

Next, as shown in FIG. 4G, the light sources 20 are placed on the upper surfaces of the bonding members 30. In this step, the light sources 20 are placed such that the electrodes 23 (first surface 20a) face away from the light modulating member. In other words, the light sources 20 are placed such that the electrodes 23 are located on the upper side. That is, the light sources 20 are placed such that the second surfaces 20b of the light sources 20 face the upper surfaces of the bonding members 30. Thereafter, the bonding members 30 are cured, whereby the light sources 20 and the light modulating members 50 are bonded together.

(7) Step of providing a light-reflective member covering the second principal surface.

Figure 4H:
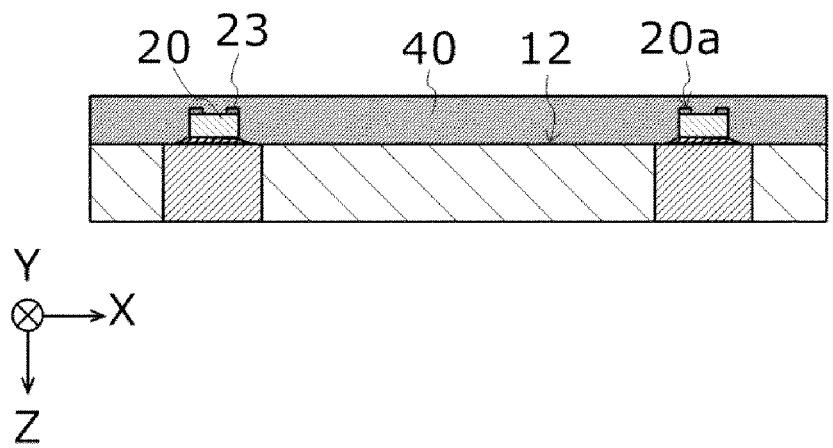
FIG. 4H is a schematic cross-sectional view showing an example of a manufacturing step of a light-emitting module according to an embodiment of the present disclosure.

Next, as shown in FIG. 4H, a light-reflective member 40 is formed so as to cover the second principal surface 12 of the lightguide plate 10. In this step, the light-reflective member 40 is formed to be thick enough to cover the electrodes (first surface 20a) of the light sources 20. The light-reflective member 40 can be formed by, for example, applying a light-reflective member 40 in a liquid form by a method such as transfer molding method, compression molding method, potting method, printing method, spraying method, etc., and curing the applied light-reflective member 40.

Figure 4I:
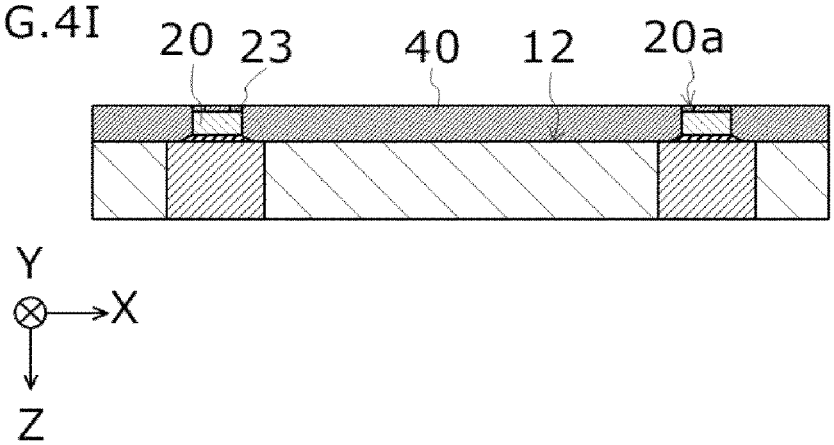
FIG. 4I is a schematic cross-sectional view showing an example of a manufacturing step of a light-emitting module according to an embodiment of the present disclosure.

Next, as shown in FIG. 4I, the light-reflective member 40 is partially removed such that the electrodes 23 of the light sources 20 are exposed. Examples of the method of removing include grinding with the use of a grinding member such as grindstone and blasting. Since the bonding members 30 have equal heights, all of the electrodes 23 of the plurality of light sources 20 can be exposed in the same step. In forming the light-reflective member 40, the light-reflective member 40 is formed such that the first surfaces 20a of the light sources 20 are exposed. Particularly, the light-reflective member 40 is formed such that the electrodes 23 are exposed.

(8) Step of forming an interconnect layer so as to be electrically coupled with a plurality of light-emitting devices.

Figure 4J:
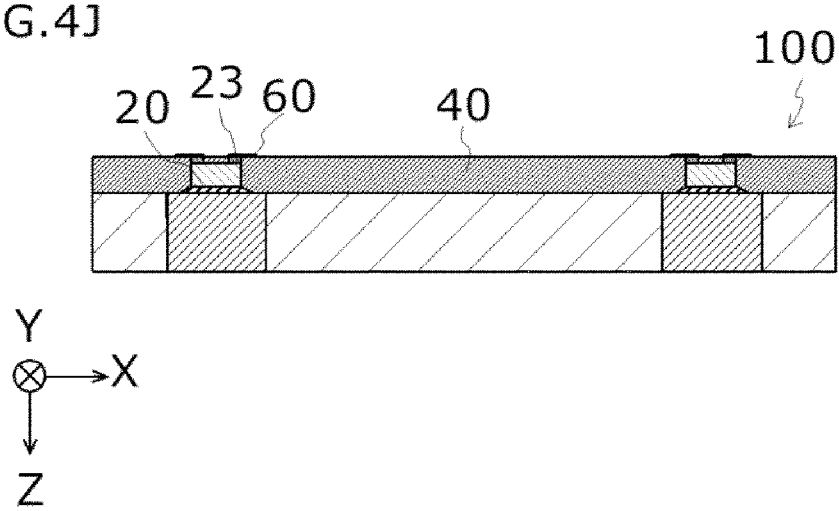
FIG. 4J is a schematic cross-sectional view showing an example of a manufacturing step of a light-emitting module according to an embodiment of the present disclosure.

Next, as shown in FIG. 4J, a metal layer, which is to be an interconnect layer 60, is formed on the electrodes 23 of the light sources 20 and the light-reflective member 40. As the interconnect layer 60, for example, Ag, Ag/Cu, Ni/Au, and the like, can be used. For the interconnect layer 60, any of these materials may be solely used. Alternatively, the interconnect layer 60 can be made of an alloy containing a plurality of materials or can have a multilayer structure. Examples of the method of forming the interconnect layer 60 include sputtering, plating, printing, adhering a metal foil, etc.

The interconnect layer 60 can be formed using a mask, or the like, so as to have a predetermined pattern. The interconnect layer 60 that has a predetermined pattern can be formed by forming a metal layer over the surface that includes the electrodes 23 of the light sources 20 and the light-reflective member 40 and thereafter partially removing the metal layer. Examples of the method of partially removing the metal layer include etching and laser light irradiation. As described hereinabove, the light-emitting module 100 of the present embodiment can be produced.

When the light-emitting module 100 includes a plurality of light sources 20, wiring can be made such that each of the light sources 20 can be independently driven. Alternatively, the light-emitting module 100 may include a plurality of light source groups, each of which includes a plurality of light sources 20 mounted in one of a plurality of divisions of the lightguide plate 10 such that the plurality of light sources 20 in one group are electrically coupled together in series or in parallel and accordingly connected with the same circuit. Such grouping enables the light-emitting module to perform local dimming. In the example shown in FIG. 3A, two of the four light sources 20 on the right-hand side are connected in series, and the other two on the left-hand side are also connected in series. These two pairs of serially-connected light sources 20 are connected in parallel.

Figure 5:
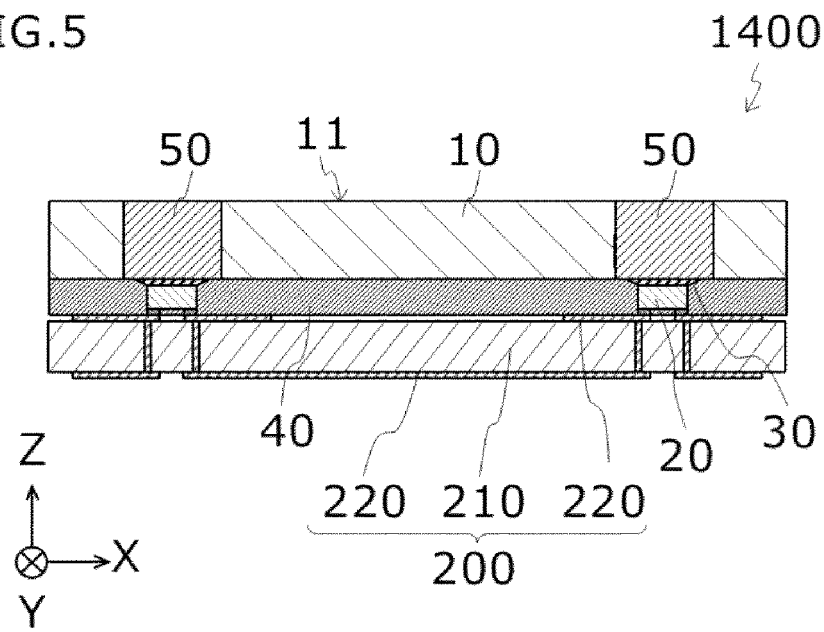
FIG. 5 is a schematic cross-sectional view showing an example of a planar light source according to an embodiment of the present disclosure.

The light-emitting module 100 produced as described above and wires 220 of the wiring board 200 can be adhered together using an adhesive sheet or the like. In this way, a planar light source 1400 such as shown in FIG. 5 can be produced. The wires 220 of the wiring board 200 are electrically coupled with external terminals 61 and 62 of the interconnect layer 60 of the light-emitting module 100 (see, FIG. 3A). The four light sources 20 can be lit up simultaneously by supplying power.

Any method may be used to bond the wiring board 200 to the light-emitting module 100. For example, an adhesive sheet is placed between a surface of the light-reflective member 40 that is provided opposite to the lightguide plate 10 and a surface of the wiring board 200 and compressed, whereby the bonding is realized. Any method may be used to electrically couple the wires 220 of the wiring board 200 and the light sources 20. For example, an electrically-conductive member that is made of a metal buried in a via hole of the wiring board 200 can be melted by application of pressure and heat so that it can be bonded to the external terminals 61 and 62 of the interconnect layer 60.

Embodiment 2

Figure 6:
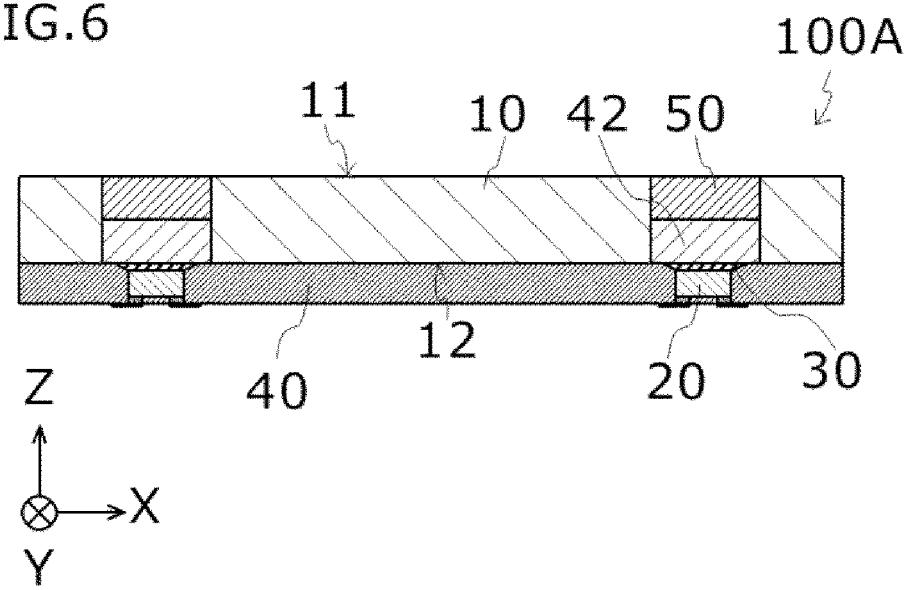
FIG. 6 is a schematic cross-sectional view showing an example of a light-emitting module according to an embodiment of the present disclosure.

FIG. 6 shows an example of a light-emitting module of Embodiment 2. In the light-emitting module 100A shown in FIG. 6, in the through holes 13 of the lightguide plate 10, light modulating members 50 are provided on the first principal surface 11 side, and light-transmitting members 42 (second light-transmitting members) are provided on the second principal surface 12 side. The light-transmitting members 42 are capable of transmitting, for example, 90% or more of the light from the light source 20. The light-transmitting members 42 can contain a wavelength converting material that is capable of absorbing the light from the light sources 20 and converting it to light at a different wavelength, such as phosphor.

In a manufacturing method of such light-emitting module 100A, the other steps than the step of providing the light modulating members 50 and the step of providing the light-transmitting members 42 are the same as those of Embodiment 1.

Figure 7A:
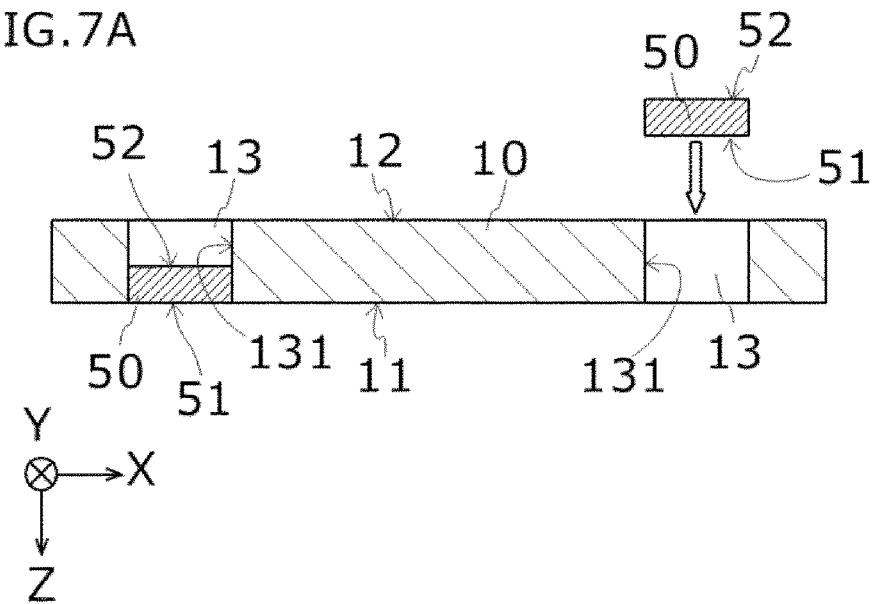
FIG. 7A is a schematic cross-sectional view showing an example of a manufacturing step of a light-emitting module according to an embodiment of the present disclosure.

The method of providing the light modulating members can include, for example, preparing premolded light modulating members 50 and placing the light modulating members 50 in the through holes 13. For example, as shown in FIG. 7A, light modulating members 50 whose width (diameter) is equal to or smaller than the width (opening diameter) of the through hole 13 are prepared by molding and inserted into the through holes 13. The planar shape of the light modulating members 50 is preferably equal to the planar shape of the through holes 13.

The first surface (upper surface) 51 or the second surface (lower surface) 52 of the molded light modulating members 50 can be a flat or curved surface. The first surface 51 or the second surface 52 of the light modulating members 50 can be a convex or concave surface.

By providing an adhesive agent between the light modulating members 50 and the inner lateral surface of the through holes 13, the light modulating members 50 can be secured inside the through holes 13. The adhesive agent can be applied to the inner lateral surface of the through holes 13 or to the lateral surface of the light modulating members 50.

The height of the light modulating members 50 is smaller than the depth of the through holes 13. For example, the height of the light modulating members 50 can be 10% to 90% of the depth of the through holes 13. When the height of the light modulating members 50 are smaller than the depth of the through holes 13, a recessed portion is formed in which the second surface 52 of the light modulating members 50 serves as the bottom surface and the inner lateral surface 131 of the through holes 13 serves as the lateral surface.

The first surface 51 or the second surface 52 of the light modulating members 50 can be a flat or curved surface. Alternatively, the first surface 51 or the second surface 52 of the light modulating members 50 can be a convex or concave surface. When an adhesive agent is provided between the light modulating members 50 and the inner lateral surface 131 of the through holes 13, the light modulating members 50 can be secured to the lightguide plate 10.

An example of the method of forming the light modulating member 50 is separating the light modulating member 50 in the form of a large-area plate or sheet into isolated pieces by cutting, punching, etc. Alternatively, small-piece molded products of the light modulating members 50 can be formed using a die, or the like, by injection molding, transfer molding, compression molding, etc.

Figure 7B:
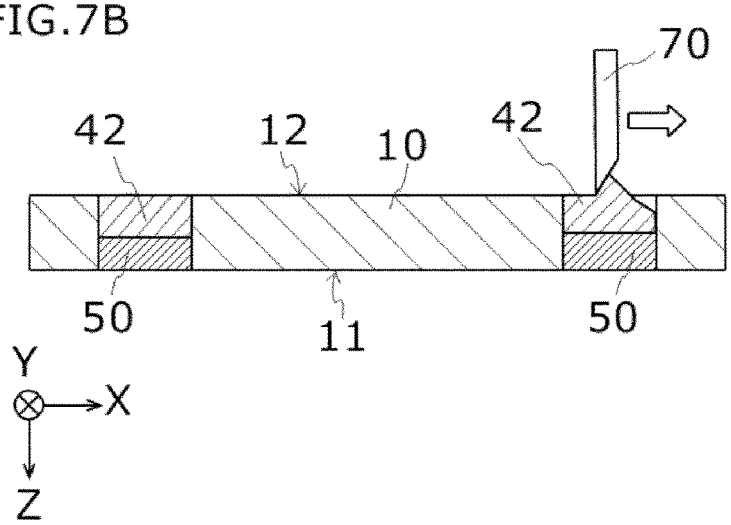
FIG. 7B is a schematic cross-sectional view showing an example of a manufacturing step of a light-emitting module according to an embodiment of the present disclosure.

Then, as shown in FIG. 7B, light-transmitting members 42 are provided on the light modulating members 50 inside the through holes 13. The method of providing the light-transmitting members 42 can be forming light-transmitting members 42 by a method such as transfer molding method, compression molding method, potting method, transfer method, printing method, jet dispensing method, etc. In the example shown in FIG. 7B, the light-transmitting members 42 are provided in the through holes 13 by a printing method with the use of a squeegee 70. Alternatively, premolded light-transmitting members 42 may be prepared and placed in the through holes 13. Thereafter, the same process as that of Embodiment 1 is carried out, whereby the light-emitting module 100A shown in FIG. 6 can be produced.

Figure 8:
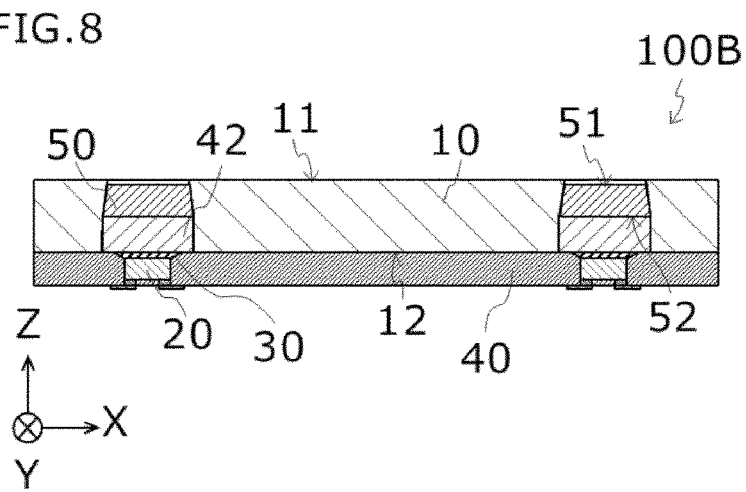
FIG. 8 is a schematic cross-sectional view showing an example of a light-emitting module according to an embodiment of the present disclosure.

The light-emitting module 100B shown in FIG. 8 is an example of a variation of the light-emitting module. In the lightguide plate 10 of the light-emitting module 100B, part of the inner lateral surface 131 of the through hole 13 is a slope surface when viewed in cross section. Specifically, part of the inner lateral surface 131 of the through hole 13 on the first principal surface 11 side is a slope surface when viewed in cross section. The present embodiment is not limited to this example. The entirety of the inner lateral surface 131 of the through hole 13 may have a slope surface. Alternatively, the inner lateral surface 131 of the through hole 13 may have a step rather than a slope surface.

The lateral surface of the molded light modulating member 50 can also be a slope surface. The lateral surface of the light modulating member 50 can have a slope surface whose angle is equal to that of the slope surface of the inner lateral surface 131 of the through hole 13.

When the width (diameter) of the molded light modulating member 50 is equal to the width (diameter) of the opening on the second principal surface 12 side of the through hole 13, the first principal surface 11 of the lightguide plate 10 and the first surface 51 of the light modulating member 50 can be coplanar.

When the width (diameter) of the light modulating member 50 is smaller than the width (diameter) of the opening on the second principal surface 12 side of the through hole 13, the first surface 51 of the light modulating member 50 may be present at a position lower than the first principal surface 11 of the lightguide plate 10 as shown in FIG. 8. In other words, the inner lateral surface 131 of the through hole 13 is partially in contact with the air layer. In this configuration, light is reflected by the air layer so that the light extraction efficiency can be improved.

Figure 9:
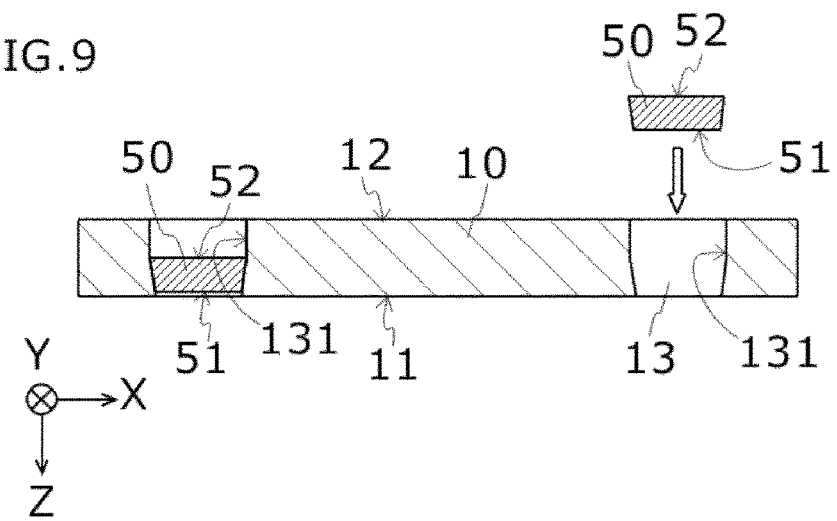
FIG. 9 is a schematic cross-sectional view showing an example of a manufacturing step of a light-emitting module according to an embodiment of the present disclosure.

As shown in FIG. 9, a lightguide plate 10 having through holes 13 is placed such that the first principal surface 11 is located on the lower side. In the example shown in FIG. 9, the opening diameter on the first principal surface 11 side of the through holes 13 is smaller than the opening diameter on the second principal surface 12 side. Then, light modulating members 50, of which the width (diameter) of the first surface 51 is greater than the width (opening diameter) of the opening diameter on the first principal surface 11 side of the through holes 13, are inserted, with the first surface 51 facing downward, into the through holes 13 from the openings on the second principal surface 12 side of the lightguide plate 10. Thus, the light modulating members 50 can be secured inside the through holes 13 without using an adhesive agent.

Figure 10:
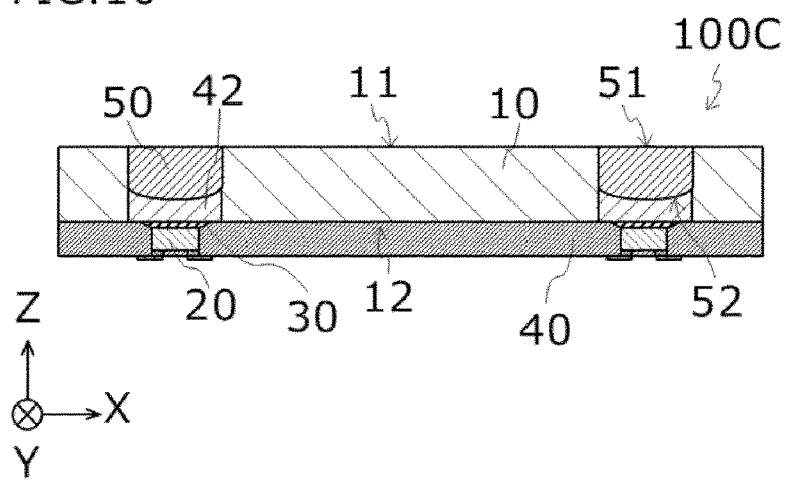
FIG. 10 is a schematic cross-sectional view showing an example of a light-emitting module according to an embodiment of the present disclosure.
Figure 11:
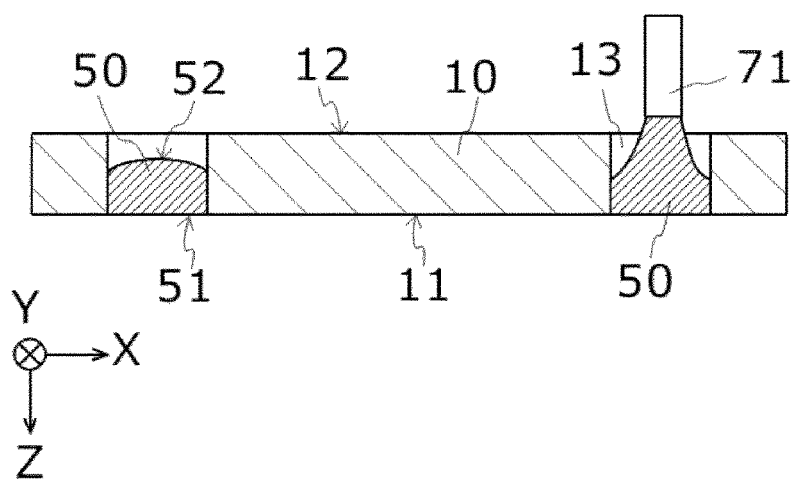
FIG. 11 is a schematic cross-sectional view showing an example of a manufacturing step of a light-emitting module according to an embodiment of the present disclosure.

FIG. 10 shows another example of a variation of the light-emitting module. In the light modulating member 50 of the light-emitting module 100C shown in FIG. 10, the second surface 52 is a convex surface. Such a light modulating member 50 can be formed by, for example, supplying a light modulating member 50 in a liquid form into the through holes 13 using a dispensing nozzle 71, so that the upper surface (second surface 52) is a convex surface due to surface tension as shown in FIG. 11, and curing the light modulating member 50. Thereby, as shown in FIG. 10, a light modulating member 50 convexed toward the light source 20 side can be provided right above the light source 20. Inclusion of such a light modulating member 50 enables light from the light source 20 to efficiently spread in horizontal directions.

Figure 12:
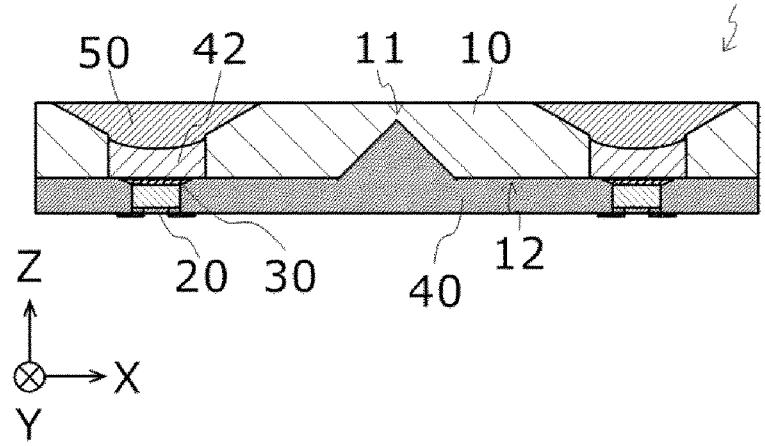
FIG. 12 is a schematic cross-sectional view showing an example of a light-emitting module according to an embodiment of the present disclosure.

FIG. 12 shows another example of a variation of the light-emitting module. The through holes 13 of the lightguide plate 10 of the light-emitting module 100D shown in FIG. 12 are configured such that the width (diameter) of the opening on the first principal surface 11 side is greater than the width (diameter) of the opening on the second principal surface 12 side. Furthermore, the through holes 13 include a portion whose width is greater at a position closer to the opening on the first principal surface 11 side.

Figure 13:
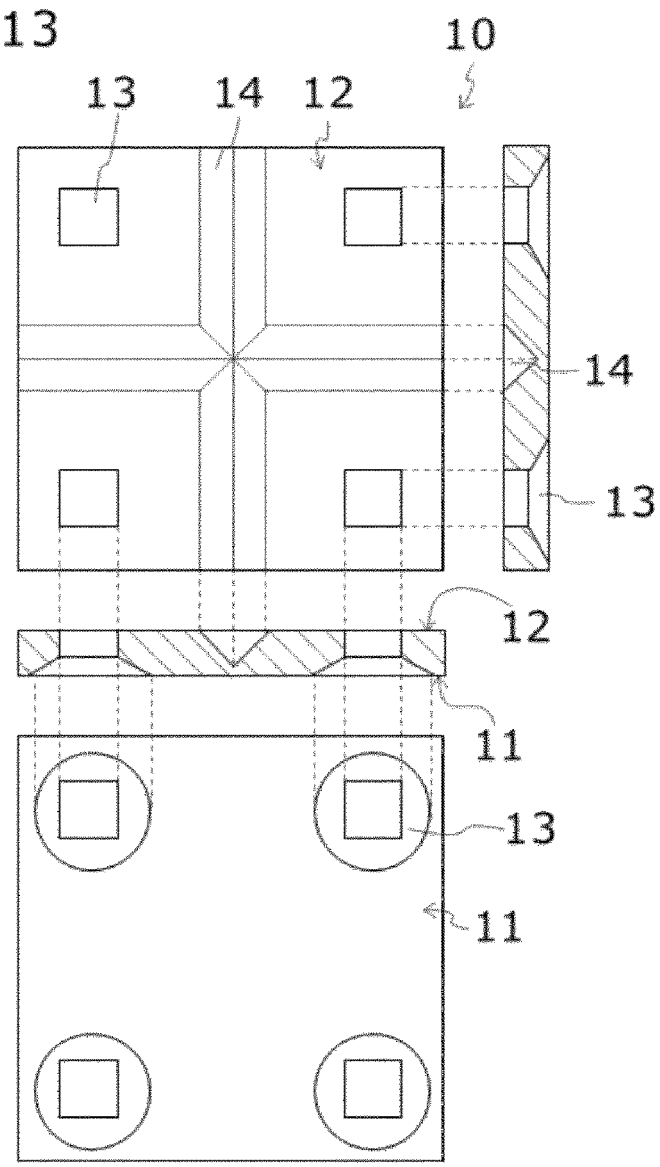
FIG. 13 shows schematic plan views and schematic cross-sectional views showing an example of a lightguide plate of a light-emitting module according to an embodiment of the present disclosure.

FIG. 13 is a schematic cross-sectional view of the lightguide plate 10 for use in the light-emitting module 100D shown in FIG. 12. Such a lightguide plate 10 is provided, and a light modulating member 50 in a liquid form is supplied into the through hole 13 from the opening on the second principal surface 12 side using a dispensing nozzle 71 by the same method as that illustrated in FIG. 11. Thereby, the light modulating member 50 convexed toward the light source 20 side and having a slope surface can be provided right above the light source 20. Inclusion of such a light modulating member 50 enables light from the light source 20 to efficiently spread in horizontal directions.

The lightguide plate 10 shown in FIG. 13 includes a recessed portion 14 on the second principal surface 12 side. The recessed portion 14 is located between adjoining through holes 13 in a cross-sectional view. The recessed portion 14 is in an annular arrangement so as to surround the through holes 13 in a plan view. In this recessed portion 14, part of the light-reflective member 40 can be arranged as shown in FIG. 12. Due to this arrangement, light from the light sources 20 is more likely to be reflected toward the first principal surface 11 side.

Embodiment 3

Figure 15:
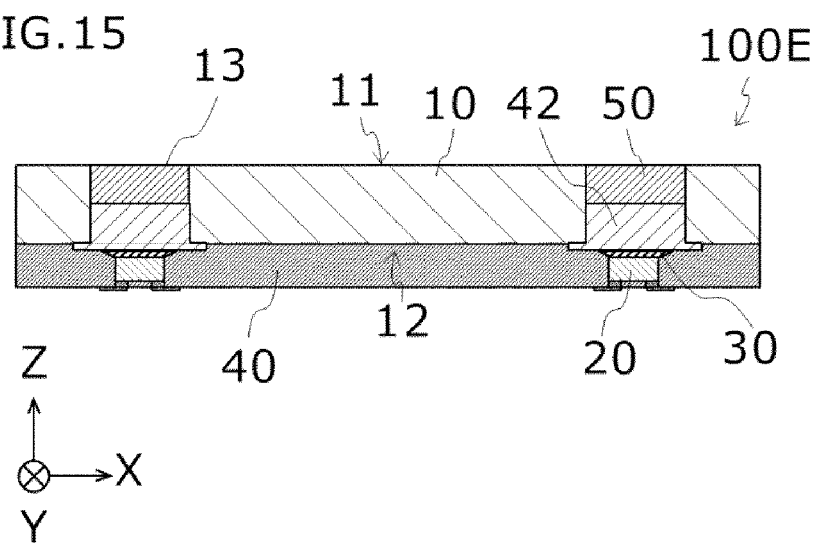
FIG. 15 is a schematic cross-sectional view showing an example of a light-emitting module according to an embodiment of the present disclosure.

FIG. 15 shows an example of a light-emitting module of Embodiment 3. The light-emitting module 100E shown in FIG. 15 has the same configuration as Embodiment 2 in that, in the through holes 13 of the lightguide plate 10, the light modulating members 50 are provided on the first principal surface 11 side and the light-transmitting members 42 are on the second principal surface 12 side. In Embodiment 3, the light-transmitting members 42 are located above the openings of the through holes 13. In the example shown in FIG. 15, the light-transmitting members 42 are extended over the second principal surface 12 from the through holes 13.

Figure 16A:
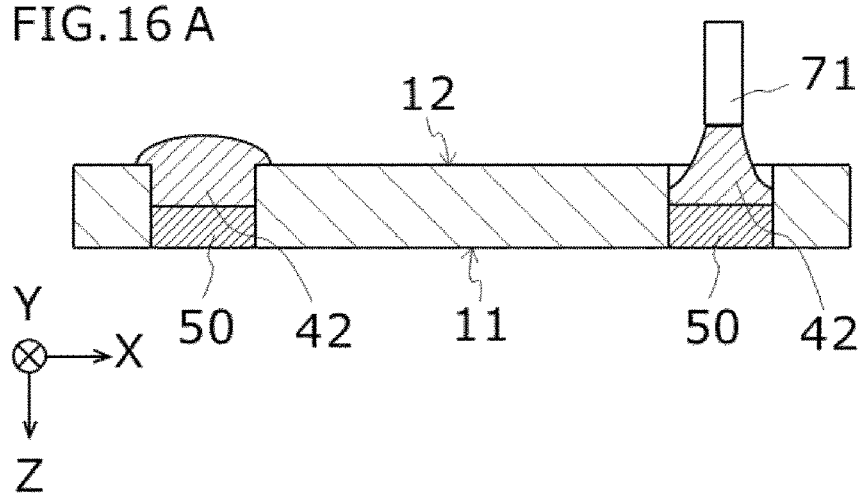
FIG. 16A is a schematic cross-sectional view showing an example of a manufacturing step of a light-emitting module according to an embodiment of the present disclosure.
Figure 16B:
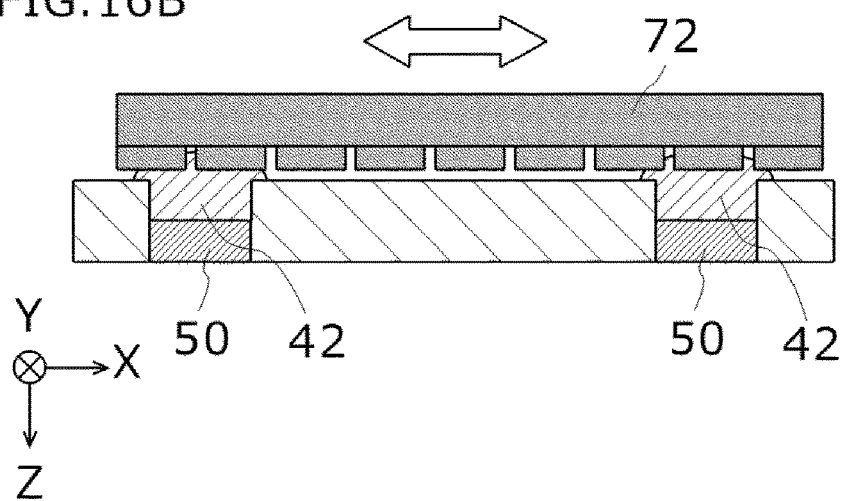
FIG. 16B is a schematic cross-sectional view showing an example of a manufacturing step of a light-emitting module according to an embodiment of the present disclosure.

The method of forming the thus-configured light-transmitting members 42 includes, firstly, as shown in FIG. 16A, providing light-transmitting members 42 on the light modulating members 50 in the through holes 13 using a dispensing nozzle 71 or the like. In this step, the light-transmitting members 42 are formed such that the upper surfaces of the light-transmitting members 42 are at higher positions than the second principal surface 12. Thereafter, as shown in FIG. 16B, the heights of the light-transmitting members 42 are equalized using a grinding member 72. By equalizing the heights of the light-transmitting members 42, grinding of the lightguide plate 10 itself can be suppressed. If there are minute recessed and raised portions, such as grind marks, in the lightguide plate 10, light is diffused at that portion so that the propagation efficiency of light is likely to decrease. Thus, by grinding down the light-transmitting member 42 so that the upper surfaces of the light-transmitting member 42 is at higher positions than the second principal surface 12, the optical loss caused by grind marks can be reduced. Note that the heights of the light-transmitting members 42 may be equalized by pushing.

The other steps than the step of equalizing the heights of the upper surfaces of the light-transmitting members 42 may be the same as those of Embodiment 2. In Embodiment 3, on the light-transmitting members 42 of equal heights, bonding members 30 can be provided as shown in the left part of FIG. 16C. In this case, the step of equalizing the heights of the provided bonding members may be carried out or may be omitted.

Figure 16C:
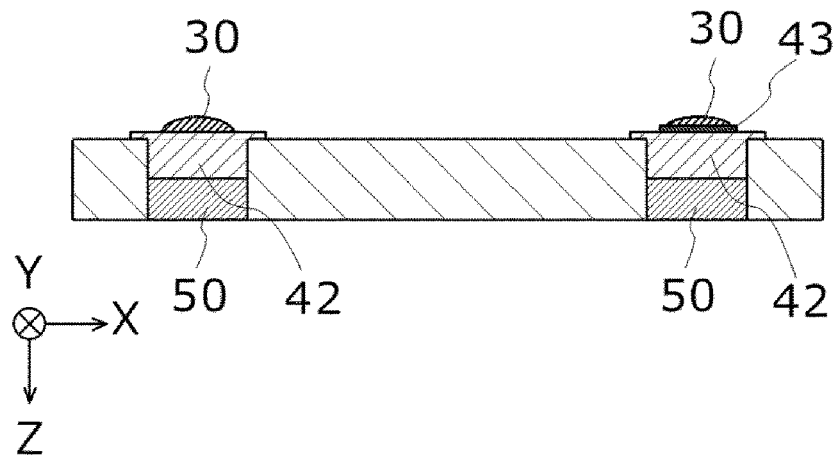
FIG. 16C is a schematic cross-sectional view showing an example of a manufacturing step of a light-emitting module according to an embodiment of the present disclosure.

Alternatively, as shown in the right part of FIG. 16C, a wavelength conversion member 43 may be provided on the light-transmitting member 42, and a bonding member 30 may be provided on the wavelength conversion member 43. The wavelength conversion member 43 can be in the form of a premolded sheet or block. Alternatively, the wavelength conversion member 43 may be formed by potting, transferring, printing, or the like.

The components of the light-emitting module are described in detail in the following sections.

Lightguide Plate

When the planar shape of the lightguide plate 10 is quadrangular, the size of the lightguide plate 10 in a plan view can be, for example, about 1 cm to 200 cm on one side, preferably about 3 cm to 30 cm on one side. The thickness of the lightguide plate 10 can be about 0.1 mm to 5 mm, preferably 0.5 mm to 3 mm. Herein, even if the first principal surface 11 or the second principal surface 12 has recessed or raised portions, the "thickness" refers to a thickness that is assumed not to have the recessed or raised portions. For example, the vertical distance between the first principal surface 11 and the second principal surface 12 at positions around the through holes 13 is considered as the thickness of the lightguide plate 10 (see, e.g., FIG. 4B). The planar shape of the lightguide plate 10 can be, for example, rectangular such as square, oblong square, or the like. Alternatively, the planar shape of the lightguide plate 10 can be polygonal such as triangular, hexagonal, octagonal, or the like, circular, oval, etc. Still alternatively, the planar shape of the lightguide plate 10 can be a combination of the aforementioned shapes, a partially-rounded shape, a partially cutaway shape, or the like.

Examples of the material that may be used for the lightguide plate 10 include optically-transparent resin materials and glass. For example, thermoplastic resins such as acrylic, polycarbonate, cyclic polyolefin, polyethylene terephthalate and polyester, and thermosetting resins such as epoxy and silicone can be used for the lightguide plate 10. Particularly, thermoplastic resin materials are preferred because the lightguide plate 10 can be efficiently produced by injection molding. Among others, polycarbonate is preferred because it has high transparency and is inexpensive. Alternatively, when an inexpensive material such as polyethylene terephthalate is used, the cost of the light-emitting module can be reduced. Furthermore, the thermal resistance can be improved as compared with polycarbonate.

The lightguide plate 10 may be in the form of a single layer or may have a multilayer structure consisting of a plurality of light-transmitting layers. When the lightguide plate 10 has a multilayer structure consisting of a plurality of light-transmitting layers, the respective layers can be adhered together using an adhesive agent. When the lightguide plate 10 has a multilayer structure consisting of a plurality of light-transmitting layers, the lightguide plate 10 can be configured such that some or all of the layers have through holes or recessed portions and thus there are air layers inside the lightguide plate. Due to this configuration, light is more likely to diffuse, and a light-emitting module of reduced unevenness in luminance can be realized.

Through Hole

The through holes 13 penetrate through the lightguide plate 10 from the first principal surface 11 to the second principal surface 12. Inside the through holes 13, the light sources 20 are provided.

The plurality of through holes 13 are in a two-dimensional arrangement when the lightguide plate 10 is viewed from above. Preferably, the plurality of through holes 13 are two-dimensionally arranged along two orthogonal directions, i.e., x direction (transverse direction) and y direction (longitudinal direction). For example, as shown in FIG. 2A and FIG. 2B, the arrangement pitch in x direction and the arrangement pitch in y direction of the through holes 13 may be equal or may be different. The two directions of arrangement may not be orthogonal to each other. The arrangement pitch in x direction or the arrangement pitch in y direction of the through holes 13 is not limited to equal intervals but may be irregular intervals. For example, the through holes 13 may be arranged such that the intervals become greater from the center to the periphery of the lightguide plate 10.

The openings of the through holes 13 can have a circular or oval shape in a plan view. Alternatively, the openings of the through holes 13 can have a quadrangular shape such as square, diamond, rectangle, etc. Still alternatively, the openings of the through holes 13 can have a polygonal shape such as triangle, hexagon, octagon, etc.

Recessed Portion: Reflector

In the lightguide plate 10, the second principal surface 12 may be a flat surface except for the through holes 13. The lateral surfaces of the recessed portion 14 can function as a reflector for reflecting light from the light sources 20 provided in the through holes 13 so as to travel toward the first principal surface 11 side. Thus, the recessed portion 14 is preferably provided for each of the through holes 13 in a plan view.

The lateral surfaces of the recessed portion 14 in a cross-sectional view can be linear or curved, or may be a combination thereof. When the lateral surfaces of the recessed portion 14 are curved, the curvature of the curved lateral surfaces may be constant, or the curved lateral surfaces may have an arbitrary curvature at a certain position.

Light Source

FIG. 14A to FIG. 14F illustrate light sources 20 that can be used in the light-emitting module of the embodiment. Each of the light sources 20 has the first surface (lower surface) 20a including the electrodes 23 and the second surface (upper surface) 20b opposite to the first surface 20a.

As the light source 20, a light-emitting device 21 can be used. Alternatively, as the light source 20, a light-emitting unit can be used which includes a light-emitting device 21 and a member covering the light-emitting device 21.

Figure 14A:
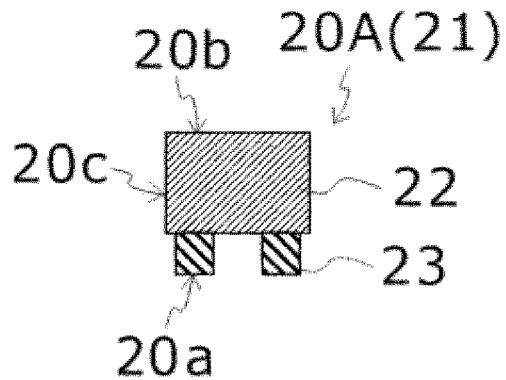
FIG. 14A is a schematic cross-sectional view showing an example of a light source according to an embodiment of the present disclosure.

The light source 20A shown in FIG. 14A includes only a light-emitting device 21. The light-emitting device 21 includes a semiconductor layered structure 22 and a pair of electrodes 23 provided on the lower surface of the semiconductor layered structure 22. The first surface 20a of the light source 20A is the first surface of the light-emitting device 21. The second surface 20b of the light source 20A is identical with the upper surface of the light-emitting device 21. The lateral surfaces of the light source 20A are identical with the lateral surfaces of the light-emitting device 21.

The light-emitting device 21 can be a known semiconductor light-emitting device such as light-emitting diode. The composition, emission wavelength, size, number, etc., of the semiconductor layered structures 22 of the light-emitting device 21 used can be appropriately selected according to the purpose of use. The light-emitting device 21 can be a light-emitting device that is designed to emit light at a wavelength in the ultraviolet-to-visible range. For example, as a light-emitting device capable of emitting ultraviolet light, blue light and green light, a light-emitting device can be used that includes a nitride-based semiconductor ($In_xAl_yGa_{1-x-y}N$, $0 \leq X$, $0 \leq Y$, $X+Y \leq 1$) as the semiconductor layered structure 22. As a light-emitting device capable of emitting red light, a light-emitting device can be used that includes GaAs, GaP, InP, or the like. The emission wavelength can be variously selected according to the materials of the semiconductor layered structure 22 and the mixed crystal ratios thereof.

The shape of the semiconductor layered structure 22 of the light-emitting device 21 can be a quadrangular shape such as square, rectangle, etc., or a polygonal shape such as triangle, hexagon, etc., in a plan view. The size of the light-emitting device in a plan view can be, for example, 50 µm to 1000 µm on one side. The height of the light-emitting device 21 can be, for example, 5 µm to 300 µm.

For the electrodes 23 of the light-emitting device 21, for example, Cu, Au, Ni, or the like, can be used. The thickness of the electrodes 23 can be, for example, 0.5 µm to 100 µm.

Figure 14B:
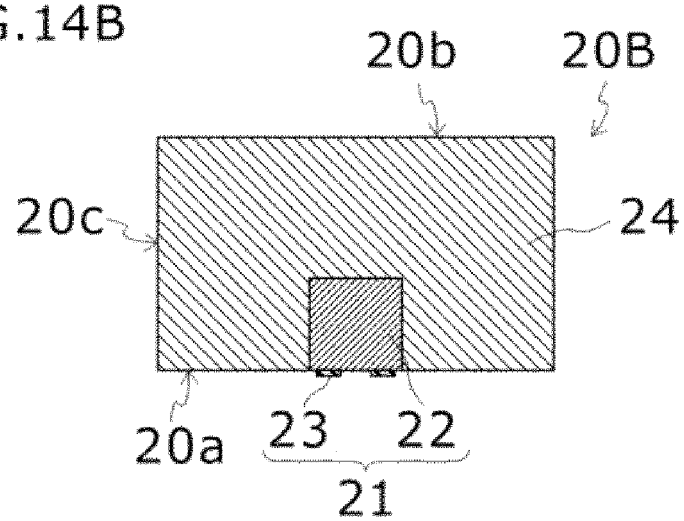
FIG. 14B is a schematic cross-sectional view showing an example of a light source according to an embodiment of the present disclosure.
Figure 14C:
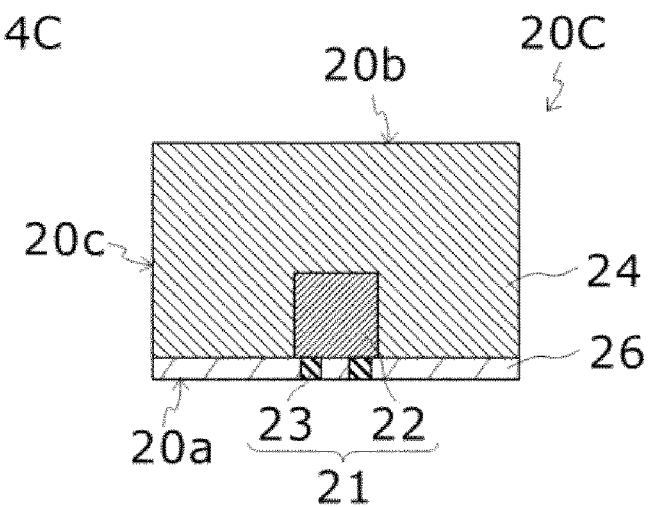
FIG. 14C is a schematic cross-sectional view showing an example of a light source according to an embodiment of the present disclosure.

The light sources 20B and 20C shown in FIG. 14B and FIG. 14C, respectively, are light-emitting units in which the lateral surfaces and the upper surface of the semiconductor layered structure 22 of the light-emitting device 21 are covered with a light-transmitting member (first light-transmitting member) 24. The light-transmitting member 24 forms parts of the lateral surfaces of the light source at the lateral sides of the light-emitting device 21 and can facilitate outgoing of light emitted from the lateral sides of the light-emitting device 21 toward the lateral sides of the light source. At least part of the light-transmitting member 24 of the thus-configured light source is provided in the through holes 13, so that light can be guided from the inner lateral surface of the through holes 13 into the lightguide plate 10.

The light-transmitting member 24 may be in the form of a single layer or may have a multilayer structure consisting of a plurality of layers. When the light-transmitting member has a multilayer structure, for example, the light-transmitting member 24 can be a combination of a layer that contains a wavelength converting material such as phosphor and a layer that does not contain a wavelength converting material. Alternatively, the light-transmitting member 24 can be realized by a plurality of layers containing different wavelength converting materials.

In the light source 20B, the lower surface of the semiconductor layered structure 22 and the electrodes 23 of the light-emitting device 21 are exposed out of the light-transmitting member 24. In this case, reducing the thickness of the electrodes 23 of the light-emitting device 21 is preferred. The thickness of the electrodes 23 can be, for example, about 0.5 µm to 100 µm. Due to such a configuration, the thickness of the light source can be reduced. Thus, the light-emitting module can be configured to have a thin structure.

The light source 20C includes a light-reflective covering member 26 that covers the lower surface of the semiconductor layered structure 22 and the lateral surfaces of the electrodes 23 of the light-emitting device 21. That is, the first surface 20a of the light source is formed by lower surfaces of the covering member 26 and the electrodes 23 of the light-emitting device 21. This configuration suppresses absorption of light from the light-emitting device 21 by the wiring board or other components.

Figure 14F:
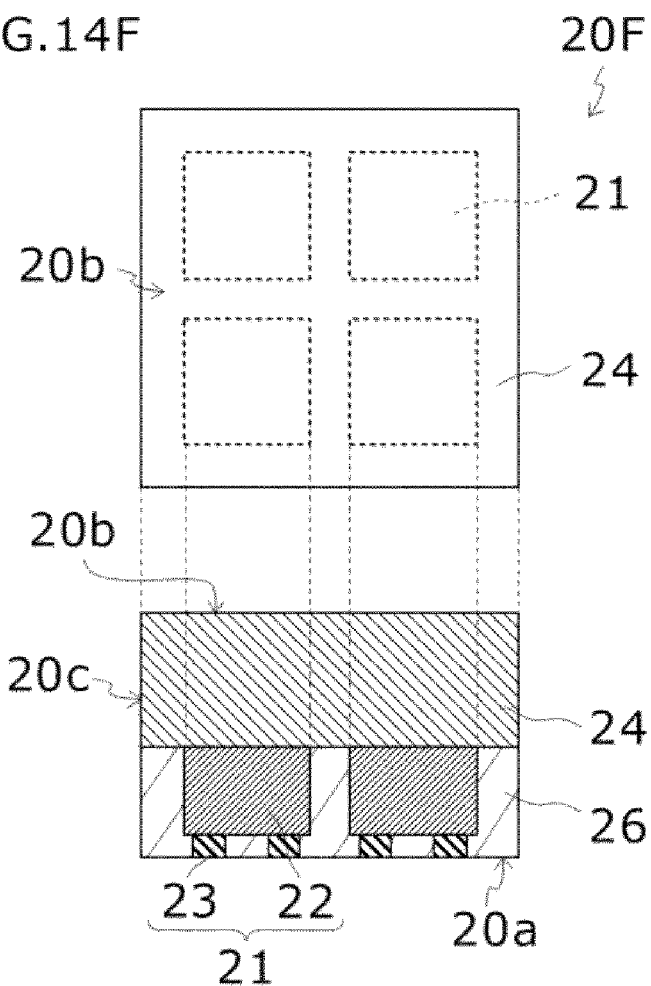
FIG. 14F shows a schematic plan view and a schematic cross-sectional view showing an example of a light source according to an embodiment of the present disclosure.

The light sources 20D to 20F shown in FIG. 14D to FIG. 14F, respectively, are light-emitting units in which a light-reflective covering member 26 is provided on the lateral sides of the light-emitting device 21. Due to such configurations of the light sources, light from the light-emitting device 21 is more likely to enter the light modulating member 50. When the light-transmitting member 24 contains a wavelength converting material, the light-reflective covering member 26 provided on the lateral sides of the light-emitting device 21 can suppress entry of only light from the light-emitting device 21 into the light modulating member 50. That is, color-mixed light of the light from the light-emitting device 21 and the light from the wavelength converting material can be allowed to enter the light modulating member 50, so that unevenness in emission color can be reduced.

The covering member 26 directly or indirectly covers the lateral surfaces of the semiconductor layered structure 22 of the light-emitting device 21. In the light sources 20D and 20E, the covering member 26 covers the lateral surfaces of the semiconductor layered structure 22 of the light-emitting device 21 via a light-transmitting bonding member 25 that covers the lateral surfaces of the semiconductor layered structure 22 of the light-emitting device 21. However, the present embodiment is not limited to this example. As in the light source 20F, the covering member 26 may be in contact with the lateral surfaces of the semiconductor layered structure 22 of the light-emitting device 21.

In the light source 20E, the covering member 26 covers the lateral surfaces of the light-transmitting member 24. Due to such a configuration, light can be efficiently introduced into the light modulating member 50 that is present on the upper surface of the light-transmitting member 24. When the light-transmitting member 24 contains a wavelength converting material, the light-reflective covering member 26 provided on the lateral sides of the light-transmitting member 24 can efficiently suppress entry of only light from the light-emitting device 21 into the light modulating member 50. That is, color-mixed light of the light from the light-emitting device 21 and the light from the wavelength converting material can be allowed to efficiently enter the light modulating member 50, so that unevenness in emission color can be reduced.

In the light sources 20D and 20E, the light-transmitting member 24 and the light-emitting device 21 are fixed together by the light-transmitting bonding member 25. The light-transmitting bonding member 25 covers the lateral surfaces of the semiconductor layered structure 22 of the light-emitting device 21. A part of the light-transmitting bonding member 25 may be present between the light-emitting device 21 and the light-transmitting member 24. Alternatively, the light-transmitting bonding member 25 may be omitted as in the light source 20F. For the light-transmitting bonding member 25, an epoxy resin, a silicone resin, a mixture resin thereof, or the like, can be used.

The light source 20F includes a plurality of light-emitting devices 21. In the example described herein, the light source 20F includes four light-emitting devices 21 arrayed in two columns and two rows. The number of light-emitting devices 21 is not limited to four. The light-emitting devices 21 may have equal emission wavelengths or may have different emission wavelengths. For example, in the upper part of FIG. 14F, the upper row can include a red light-emitting device on the left and a green light-emitting device on the right, and the lower row can include a blue light-emitting device on the left and a red light-emitting device on the right. When the light source 20F thus includes light-emitting devices of three primary colors of light, the light-transmitting member 24 provided on the light-emitting devices does not need to contain a wavelength converting material.

A light source in which the bottom surface of the semiconductor layered structure 22 and the lateral surfaces of the electrodes 23 of the light-emitting devices 21 are covered with the covering member 26 or the light-transmitting member 24 may include a metal film that covers the electrodes 23, such as plating layer, sputtered film, etc. The material of the metal film can have, for example, a multilayer structure realized by sequentially forming layers of Cu/Ni/Au in this order. The metal film may be arranged so as to continuously cover the electrodes 23 and a part of the covering member 26 or the light-transmitting member 24, which covers the lateral surfaces of the pair of electrodes 23.

Light-Transmitting Member

The light-transmitting member 24 is capable of transmitting at least light from the light-emitting device 21. The light-transmitting member 24 is capable of transmitting 60% or more, preferably 90% or more, of the light emitted from the light-emitting device 21. As the material of the light-transmitting member 24, a light-transmitting, thermosetting resin material such as epoxy resin, silicone resin, or the like, can be used.

The light-transmitting member 24 may contain a phosphor in the form of particles as the wavelength converting material in the above-described resin material. The wavelength converting material includes a wavelength converting material capable of converting the wavelength of light emitted from the light-emitting device 21, such as phosphor. The light-transmitting member 24 may include a single layer containing a wavelength converting material or a plurality of layers each of which contains a wavelength converting material. Alternatively, the light-transmitting member 24 can include a multilayer structure consisting of a layer that contains a wavelength converting material and a layer that does not substantially contain a wavelength converting material.

Examples of the phosphor include yttrium-aluminum-garnet-based phosphors (e.g., $Y_3(Al,Ga)_5O_{12}$:Ce), lutetium-aluminum-garnet-based phosphors (e.g., $Lu_3(Al,Ga)_5O_{12}$:Ce), terbium-aluminum-garnet-based phosphors (e.g., $Tb_3(Al,Ga)_5O_{12}$:Ce), silicate-based phosphors (e.g., $(Ba,Sr)_2SiO_4$:Eu), and chlorosilicate-based phosphors (e.g., $Ca_8Mg(SiO_4)_4Cl_2$:Eu). Examples of the phosphor further include, as nitride-based phosphors, β-sialon-based phosphors (e.g., $Si_{6-z}Al_zO_zN_{8-z}$:Eu(0<z<4.2)) α-sialon-based phosphors (e.g., $M_z(Si,Al)_{12}(O,N)_{16}$ (where 0<z≤2, "M" is Li, Mg, Ca, Y, or a lanthanide element exclusive of La and Ce), and nitrogen-containing calcium aluminosilicate (CASN or SCASN)-based phosphors (e.g., $(Sr,Ca)AlSiN_3$:Eu). Examples of the phosphor further include phosphors represented by general formula (I): $Ma_xMb_yAl_3N_z$:Eu (where "Ma" is at least one element selected from the group consisting of Ca, Sr and Ba, "Mb" is at least one element selected from the group consisting of Li, Na and K, and "x", "y" and "z" respectively meet 0.5≤x≤1.5, 0.5≤y≤1.2 and 3.5≤z≤4.5). Examples of the phosphor further include SGS-based phosphors (e.g., $SrGa_2S_4$:Eu). Examples of the phosphor further include manganese-activated fluoride-based phosphors (i.e., phosphors represented by general formula (II): $A_2[M_{1-a}Mn_aF_6]$ (where "A" is at least one selected from the group consisting of K, Li, Na, Rb, Cs and $NH_4$; "M" is at least one element selected from the group consisting of Group IV elements and Group XIV elements; and "a" meets 0<a<0.2)). Typical examples of the manganese-activated fluoride-based phosphors include phosphors of manganese-activated potassium fluorosilicate(e.g., $K_2SiF_6$:Mn (KSF)).

A single light-transmitting member can contain one type or a plurality of types of phosphors. The plurality of types of phosphors may be mixed together or put into different layers. For example, a light-emitting device 21 capable of emitting blue light can be used with a β-sialon phosphor capable of emitting green light and a fluoride based phosphor capable of emitting red light such as KSF phosphor. Using such two types of phosphors can increase the color reproduction range of the light-emitting module. Alternatively, the phosphor may be quantum dots.

The phosphor may be provided in any fashion inside the light-transmitting member 24. For example, the phosphor may be generally uniformly distributed throughout the wavelength conversion member or may be unevenly distributed in some parts.

The light-transmitting member 24 may contain a light diffusing substance. Examples of the light diffusing substance include fine particles of $SiO_2$, $TiO_2$, $Al_2O_3$, ZnO, etc.

The light-transmitting members (second light-transmitting members) 42 provided in the through holes 13 can be the same as the light-transmitting members (first light-transmitting members) 24 used for the above-described light sources 20. The first light-transmitting members 24 and the second light-transmitting members 42 may be identical or may be different. Alternatively, the first light-transmitting members 24 may contain a wavelength converting material while the second light-transmitting members 42 may not substantially contain a wavelength converting material. On the contrary, the second light-transmitting members 42 may contain a wavelength converting material while the first light-transmitting members 24 may not substantially contain a wavelength converting material.

Covering Member

The covering member 26 is a light-reflective member. The reflectance of the covering member 26 for the light emitted from the light-emitting device 21 can be, for example, not less than 60%, preferably not less than 70%, more preferably not less than 90%. The material of the covering member 26 is preferably a resin material in which a white pigment or the like is contained. Particularly preferably, the material of the covering member 26 is a silicone resin in which titanium oxide is contained.

Bonding Member

The bonding member 30 is a light-transmitting member for bonding together the light sources 20 and the lightguide plate 10. As the material of the bonding member 30, an epoxy resin, a silicone resin, a mixture thereof, or a light-transmitting material such as glass, may be used.

Light-Reflective Member

The light-reflective member 40 covers the plurality of light sources 20 and the second principal surface 12 of the lightguide plate 10. When the light-reflective member 40 covers the entirety of the second principal surface 12, light from the light sources 20 can be efficiently introduced into the lightguide plate 10.

The reflectance of the light-reflective member 40 for the light emitted from the light source 20 is not less than 60%, preferably not less than 90%. The material of the light-reflective member 40 can be, for example, a metal, a white resin material, a distributed Bragg reflector (DBR film), etc. The material of the light-reflective member 40 is, particularly preferably, a white resin material. Examples of the white resin material include resin materials containing titanium oxide as the light-reflective substance and foamed resin materials. As the resin material, a light-transmitting, thermosetting resin material such as epoxy resin, silicone resin, polyethylene terephthalate, or the like, can be used.

Light Modulating Member

The light modulating members 50 are provided in the through holes 13 of the lightguide plate 10 and preferably have the function of reflecting part of the light from the light sources 20. For example, the reflectance of the light modulating members 50 for the light emitted from the light sources 20 is 70% to 90%, preferably 80% to 85%. The material of the light modulating members 50 can be, for example, a white resin material. The material of the light modulating members is, particularly preferably, a white resin material. Examples of the white resin material include resin materials containing titanium oxide as the light-reflective substance and foamed resin materials. As the resin material, a light-transmitting, thermosetting resin material such as epoxy resin, silicone resin, polyethylene terephthalate, or the like, can be used.

Wavelength Conversion Member

The wavelength conversion members 43 are provided on the light-transmitting members (second light-transmitting members) 42 that are provided in the through holes 13. The wavelength conversion members 43 can contain the wavelength converting materials that have been previously described in conjunction with the light-transmitting members (the first light-transmitting members 24, the second light-transmitting members 42).

Wiring Board

The wiring board 200 includes an insulative base 210 and wires 220. The wires 220 are electrically coupled with the plurality of light sources 20. The wiring board 200 includes, for example, an electrically-conductive member that fills a plurality of via holes formed in the insulative base and wires electrically coupled with the electrically-conductive member at the opposite surfaces of the base.

The wiring board 200 may have a multilayer structure. For example, as the wiring board 200, a metal plate including an insulative layer at a surface may be used. Alternatively, the wiring board 200 may be a TFT substrate that includes a plurality of TFTs (Thin-Film Transistors).

The material of the base of the wiring board can be, for example, a ceramic or resin material. From the viewpoint of cost reduction and molding easiness, a resin may be selected as the material of the base. Examples of the resin include phenolic resins, epoxy resins, polyimide resins, BT resins, polyphthalamide (PPA), polyethylene terephthalate (PET), unsaturated polyester, and complex materials such as glass epoxy. The base may be a rigid substrate or may be a flexible substrate.

The wires are, for example, electrically-conductive foil (conductor layer) provided on the base and are electrically coupled with a plurality of light sources 20. The material of the wires preferably has high thermal conductivity. An example of such a material is an electrically-conductive material such as copper. The wires can be formed by plating, applying an electrically-conductive paste, printing, or the like. The thickness of the wires is, for example, about 5-50 μm.

A light-emitting module of the present disclosure can be used as, for example, a backlight for a liquid crystal display device, various display devices, etc.

While certain embodiments of the present invention have been described with respect to exemplary embodiments thereof, it will be apparent to those skilled in the art that the disclosed invention can be modified in numerous ways and can assume many embodiments other than those specifically described above. Accordingly, it is intended by the appended claims to cover all modifications of the invention that fall within the true spirit and scope of the invention.

What is claimed is:

1. A method for manufacturing a light-emitting module, comprising:
   providing a plurality of light sources each including a semiconductor layered structure and an electrode;
   providing a lightguide plate having a first principal surface to serve as a light extraction surface, a second principal surface opposite to the first principal surface, and a plurality of through holes penetrating through the lightguide plate from the first principal surface to the second principal surface;
   providing a light modulating member in each of the through holes;
   providing a plurality of bonding members on the light modulating member;
   equalizing heights of upper surfaces of the plurality of bonding members;
   placing the light sources on the bonding members such that the electrode faces away from the light modulating member;
   providing a cover member so as to cover the second principal surface; and
   forming an interconnect layer electrically coupled with the light sources.

2. The method of claim 1, wherein equalizing heights of upper surfaces of the bonding members includes grinding down the bonding members such that the upper surfaces of the bonding members have equal heights.

3. The method of claim 2, wherein providing the bonding members includes
   forming a light-transmitting member on the light modulating member, and
   providing the bonding members on the light-transmitting member.

4. The method of claim 1, wherein equalizing heights of upper surfaces of the bonding members includes pushing down the bonding members such that the upper surfaces of the bonding members have equal heights.

5. The method of claim 4, wherein providing the bonding members includes
   forming a light-transmitting member on the light modulating member, and
   providing the bonding members on the light-transmitting member.

6. The method of claim 1, wherein providing the bonding members includes
   forming a light-transmitting member on the light modulating member, and
   providing the bonding members on the light-transmitting member.

7. A method for manufacturing a light-emitting module, comprising:
- providing a plurality of light sources each including a semiconductor layered structure and an electrode;
- providing a lightguide plate having a first principal surface to serve as a light extraction surface, a second principal surface opposite to the first principal surface, and a plurality of through holes penetrating through the lightguide plate from the first principal surface to the second principal surface;
- providing a light modulating member in each of the through holes;
- providing a light-transmitting member on the light modulating member such that the light-transmitting member has an upper surface at a level at least higher than the second principal surface;
- equalizing heights of upper surfaces of the plurality of light-transmitting members;
- placing the light sources on or above the light-transmitting members such that the electrode faces away from the light modulating member;
- providing a cover member so as to cover the second principal surface; and
- forming an interconnect layer electrically coupled with the light sources.

8. The method of claim 7, wherein equalizing heights of upper surfaces of the light-transmitting members includes grinding down the light-transmitting members such that the upper surfaces of the light-transmitting members have equal heights.

9. The method of claim 8, wherein placing the light sources includes providing bonding members on the light-transmitting members.

10. The method of claim 7, wherein equalizing heights of upper surfaces of the light-transmitting members includes pushing down the light-transmitting members such that the upper surfaces of the light-transmitting members have equal heights.

11. The method of claim 10, wherein placing the light sources includes providing bonding members on the light-transmitting members.

12. The method of claim 7, wherein placing the light sources includes providing bonding members on the light-transmitting members.

* * * * *